(12) United States Patent
Hata et al.

(10) Patent No.: US 9,184,741 B2
(45) Date of Patent: Nov. 10, 2015

(54) SWITCH APPARATUS AND TEST APPARATUS

(71) Applicant: ADVANTEST CORPORATION, Tokyo (JP)

(72) Inventors: Yoshiyuki Hata, Tokyo (JP); Makoto Nakanishi, Tokyo (JP); Masahiko Takikawa, Tokyo (JP)

(73) Assignee: ADVANTEST CORPORATION, Tokyo (JP)

( * ) Notice: Subject to any disclaimer, the term of this patent is extended or adjusted under 35 U.S.C. 154(b) by 273 days.

(21) Appl. No.: 13/866,032

(22) Filed: Apr. 19, 2013

(65) Prior Publication Data

US 2014/0002105 A1 Jan. 2, 2014

(30) Foreign Application Priority Data

Jun. 28, 2012 (JP) ................................ 2012-145010

(51) Int. Cl.
| | |
|---|---|
| H03K 17/10 | (2006.01) |
| G01R 1/30 | (2006.01) |
| H03K 17/06 | (2006.01) |
| G01R 1/20 | (2006.01) |
| H03K 17/687 | (2006.01) |
| G01R 31/28 | (2006.01) |

(52) U.S. Cl.
CPC ............. *H03K 17/102* (2013.01); *G01R 1/206* (2013.01); *G01R 1/30* (2013.01); *H03K 17/063* (2013.01); *G01R 31/2844* (2013.01); *H03K 2017/066* (2013.01); *H03K 2017/6875* (2013.01); *H03K 2217/0081* (2013.01)

(58) Field of Classification Search
CPC ............. H03K 17/102; H03K 17/063; H03K 2217/0081; H03K 17/687; H03K 2017/066; G01R 1/30; G01R 31/2844; G01R 1/206

USPC .................. 324/555, 427; 323/282, 273; 257/E27.069

See application file for complete search history.

(56) References Cited

U.S. PATENT DOCUMENTS

| | | | | |
|---|---|---|---|---|
| 2006/0177947 A1* | 8/2006 | Yoshida et al. | ................... | 438/3 |
| 2009/0026499 A1* | 1/2009 | Kikawa et al. | ................ | 257/194 |
| 2010/0008130 A1* | 1/2010 | Kim et al. | ...................... | 365/158 |
| 2010/0109674 A1* | 5/2010 | Kuramochi et al. | .......... | 324/537 |
| 2011/0285408 A1* | 11/2011 | Satake et al. | .................. | 324/679 |
| 2011/0316554 A1* | 12/2011 | Hata et al. | ...................... | 324/537 |
| 2014/0361790 A1* | 12/2014 | Nakanishi et al. | ............ | 324/555 |

FOREIGN PATENT DOCUMENTS

| | | | |
|---|---|---|---|
| JP | H06-244694 A | | 9/1994 |
| KR | 10-1998-0073677 A | | 11/1998 |

OTHER PUBLICATIONS

Notice of Office Action for Korean Patent Application No. 10-2013-0050298, issued by the Korean Intellectual Property Office on Aug. 29, 2014.

* cited by examiner

*Primary Examiner* — Arleen M Vazquez
*Assistant Examiner* — Robert P Alejnikov, Jr.

(57) ABSTRACT

There is provided a semiconductor switch apparatus that can handle a wide range of input voltages. The switch apparatus includes a main switch that is provided between a first terminal and a second terminal, and a switch controller that, to turn on the main switch, supplies the same gate-source voltage to the main switch irrespective of a direction of a current flowing through the main switch. To turn on the main switch, the switch controller supplies the gate-source voltage that is determined based on at least one of a voltage of the first terminal and a voltage of the second terminal to a gate of the main switch.

16 Claims, 4 Drawing Sheets

SWITCH APPARATUS AND TEST APPARATUS

BACKGROUND

1. Technical Field

The present invention relates to a switch apparatus and a test apparatus.

2. Related Art

A semiconductor switch such as a field-effect transistor (FET) may be used as a switch apparatus that is configured to switch whether an electrical signal is allowed to be transmitted or blocked from being transmitted as disclosed in, for example, Japanese Patent Application Publication No. 06-244694.

However, such a semiconductor switch can only be used when the electrical signal has a narrow range of voltages. In particular, while the semiconductor switch allows the electrical signal to be transmitted, increasing the voltage of the input signal in the positive direction causes an increase in the difference between the gate voltage and the voltage of the input signal, which may cause the semiconductor switch to start blocking the electrical signal from being transmitted. Likewise, while the semiconductor switch blocks the electrical signal from being transmitted, increasing the voltage of the input signal in the negative direction causes a decrease in the difference between the gate voltage and the voltage of the input signal, which may cause the semiconductor switch to start allowing the electrical signal to be transmitted. If an offset voltage is applied to the gate electrode according to the voltage of the electrical signal for the purpose of widening the range of the voltages of the electrical signal, the gate-source voltage may vary depending on the direction of the current flowing through the semiconductor switch. As discussed above, there were difficulties in enlarging the range of voltages of the electrical signal that is controlled to be transmitted or not by the semiconductor switch while achieving symmetrical characteristics for the on resistance irrespective of the direction of the current.

SUMMARY

Therefore, it is an object of an aspect of the innovations herein to provide a switch apparatus and a test apparatus, which are capable of overcoming the above drawbacks accompanying the related art. The above and other objects can be achieved by combinations described in the claims. A first aspect of the innovations may include a switch apparatus including a main switch that is provided between a first terminal and a second terminal, and a switch controller that, to turn on the main switch, supplies the same gate-source voltage to the main switch irrespective of a direction of a current flowing through the main switch.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
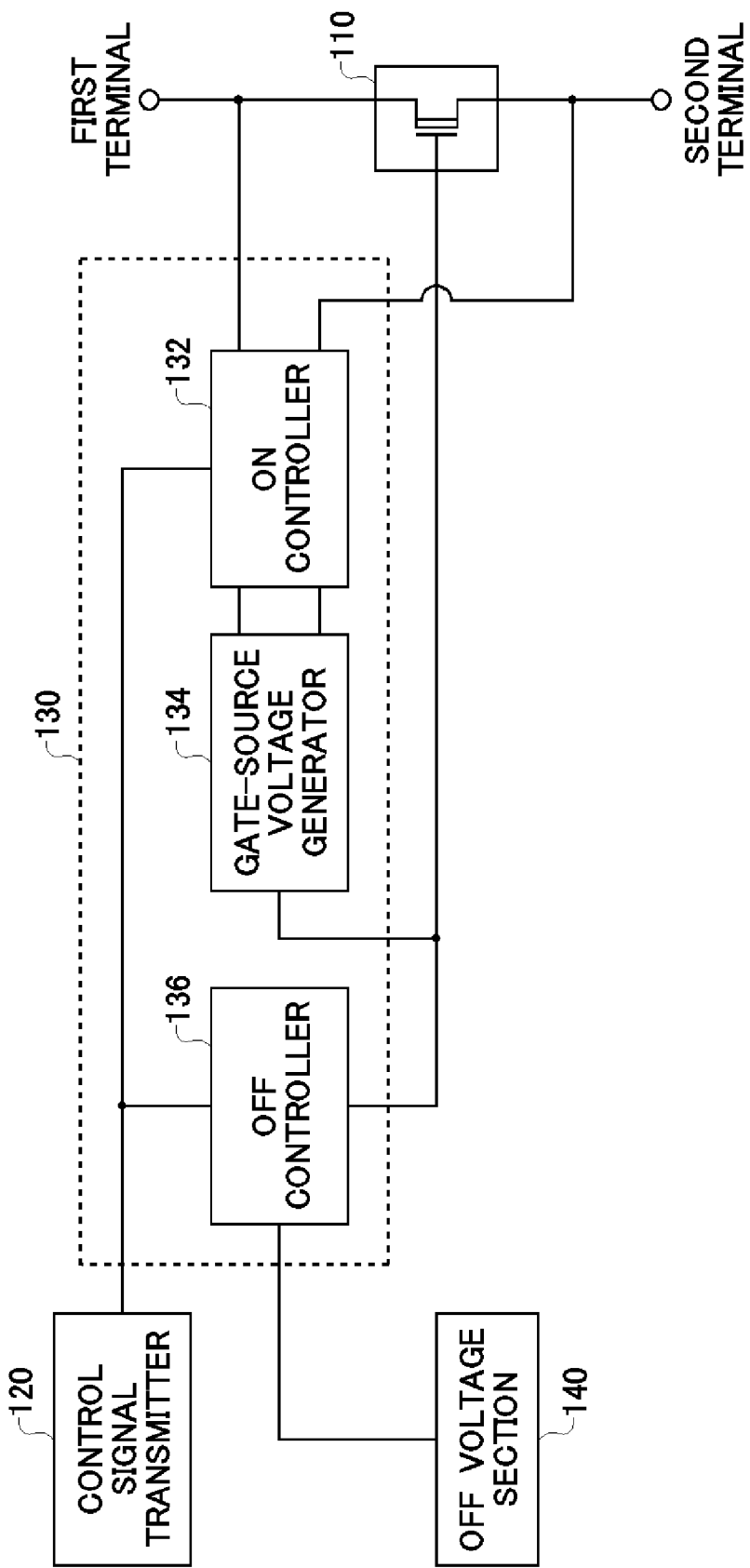
FIG. 1 shows the configuration of a switch apparatus 100 relating to an embodiment of the present invention.

FIG. 1 shows the configuration of a switch apparatus 100 relating to an embodiment of the present invention. The switch apparatus 100 supplies a gate voltage according to an input signal input into a first terminal or a second terminal, to electrically connect or disconnect between the first terminal and the second terminal. The switch apparatus 100 includes a main switch 110, a control signal transmitter 120, a switch controller 130 and an off voltage section 140.

The main switch 110 is provided between the first terminal and the second terminal. The main switch 110 includes an FET whose source and drain are connected between the first terminal and the second terminal and which is turned on or off according to the difference between the gate voltage thereof and the input voltage that is input into the first or second terminal. The main switch 110 may include a plurality of FETs and, in the present example, the main switch 110 includes a single FET.

The main switch 110 may be an N-channel FET or P-channel FET. The main switch 110 is, for example, a depletion FET. The main switch 110 may be an FET made of a compound semiconductor or a MOSFET. The main switch 110 is, for example, a GaN semiconductor switch.

The present exemplary embodiment is described under the assumption that the source of the main switch 110 is served by one of the terminal connected to the first terminal and the terminal connected to the second terminal that is supplied with carriers. For example, when the main switch 110 is an N-channel FET and the voltage of the first terminal is higher than the voltage of the second terminal, the current flows from the first terminal to the second terminal and carriers (electrons) are supplied to the FET in the direction from the second terminal to the first terminal. Thus, in this case, the terminal of the FET that is connected to the second terminal serves as the source. Alternatively, when the main switch 110 is an N-channel FET and the voltage of the first terminal is lower than the voltage of the second terminal, the current flows in the opposite direction. Thus, the terminal of the FET that is connected to the first terminal serves as the source.

When the main switch 110 is a P-channel FET and the voltage of the first terminal is higher than the voltage of the second terminal, the current flows from the first terminal to the second terminal and carriers (holes) are supplied to the FET in the direction from the first terminal to the second terminal. Thus, in this case, the terminal of the FET that is connected to the first terminal serves as the source. Alternatively, when the main switch 110 is a P-channel FET and the voltage of the first terminal is lower than the voltage of the second terminal, the current flows in the opposite direction. Thus, the terminal of the FET that is connected to the second terminal serves as the source.

The control signal transmitter 120 is connected to the switch controller 130, and transmits a control signal to switch on or off the main switch 110. For example, the control signal transmitter 120 transmits an on signal to the switch controller 130 to switch on the main switch 110, and transmits an off signal to the switch controller 130 to switch off the main switch 110.

The switch controller 130 is connected to the gate of the main switch 110, and supplies the same gate-source voltage to the main switch irrespective of the direction of the current flowing through the main switch 110 when it is intended to turn on the main switch 110. The switch controller 130 is connected to the first terminal and to the second terminal and supplies a gate-source voltage to the main switch 110 according to the voltages respectively applied to the first terminal and the second terminal.

Here, as long as the absolute value of the difference in potential between the first terminal and the second terminal is the same, the switch controller 130 supplies the same gate-source voltage irrespective of the direction of the current flowing between the first terminal and the second terminal. For example, to turn on the main switch 110, the switch controller 130 supplies, to the gate of the main switch 110, a gate-source voltage that is determined based on at least one of the voltages of the first and second terminals.

For example, to turn on the main switch 110, the switch controller 130 supplies, to the gate of the main switch 110, a higher or lower one of the voltage of the first terminal and the voltage of the second terminal. The operations of the switch controller 130 and the main switch 110 will be described later in detail. The switch controller 130 includes an on controller 132, a gate-source voltage generator 134, and an off controller 136.

The on controller 132 is connected to the control signal transmitter 120, the first terminal and the second terminal, and connects or disconnects the first and second terminals to/from the gate-source voltage generator 134 according to the control signal received from the control signal transmitter 120. For example, when receiving an on signal from the control signal transmitter 120 and it is thus intended to turn on the main switch 110, the on controller 132 allows the voltages of the first and second terminals to be input into the gate-source voltage generator 134.

On the other hand, when receiving an off signal from the control signal transmitter 120 and it is thus intended to turn off the main switch 110, the on controller 132 blocks the voltages of the first and second terminals from being input into the gate-source voltage generator 134. The on controller 132 includes, for example, two or more switch circuits that are configured to switch between conduction and non-conduction according to the control signal.

The gate-source voltage generator 134 is connected to the on controller 132, and receives the voltages of the first and second terminals to generate a gate-source voltage. The gate-source voltage generator 134 is connected to the gate of the main switch 110, generates a gate-source voltage that is designed to turn on the main switch 110 according to the voltages of the first and second terminals, and supplies the generated gate-source voltage to the gate.

The off controller 136 is connected to the gate of the main switch 110 and the off voltage section 140, and supplies an off voltage that is designed to turn off the main switch 110 to the gate of the main switch 110 when it is intended to turn off the main switch 110. The off controller 136 is connected to the control signal transmitter 120, and supplies the off voltage to the gate of the main switch 110 when receiving an off signal from the control signal transmitter 120. For example, the off controller 136 includes a switch circuit that switches whether the path from the off voltage section 140 to the gate of the main switch 110 is connected or disconnected, according to the control signal.

The off voltage section 140 outputs an off voltage to control the main switch 110. The off voltage section 140 supplies a predetermined voltage depending on the type of the FET used to constitute the main switch 110 and the minimum or maximum value for the voltages applied to the first and second terminals.

Figure 2:
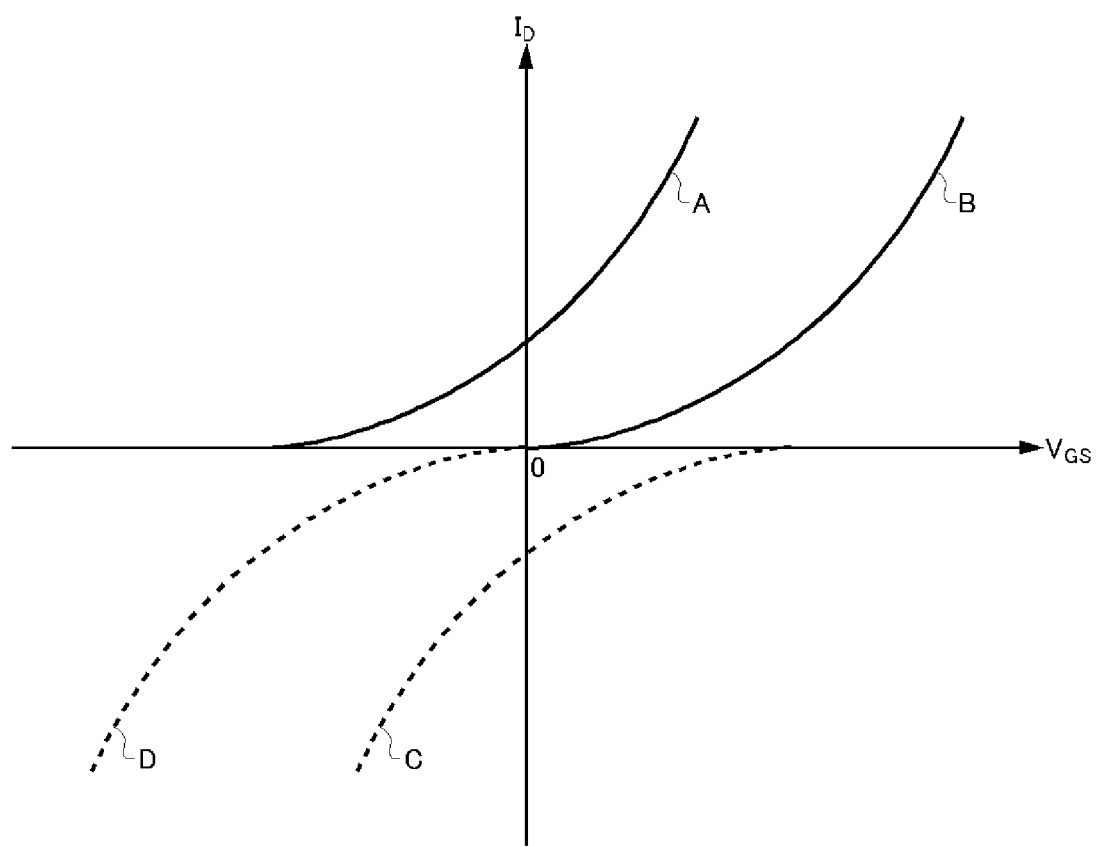
FIG. 2 shows exemplary characteristics of a drain current $I_D$ relative to a gate-source voltage $V_{GS}$ of an FET.

FIG. 2 shows exemplary characteristics of the drain current $I_D$ relative to the gate-source voltage $V_{GS}$ for various FETs. The FETs have characteristics indicated by "A" to "D" in FIG. 2, for example.

In FIG. 2, "A" represents the characteristics of an N-channel depletion FET that has normally-on characteristics, in other words, the drain current flows even when the gate-source voltage is zero. In the present exemplary embodiment, the N-channel depletion FET is fully turned on when the gate-source voltage is −6 V or higher and fully turned off when the gate-source voltage is −9 V or lower.

In FIG. 2, "B" represents the characteristics of an N-channel enhancement FET having normally-off characteristics, in other words, the drain current does not flow when the gate-source voltage is zero. The enhancement FET is turned on at a higher gate-source voltage than the depletion FET.

In FIG. 2, "C" represents the characteristics of a P-channel depletion FET having normally-on characteristics, in other words, the drain current flows even if the gate-source voltage is zero. Contrary to the N-channel FET, the P-channel FET has such a characteristic that the drain current increases as the gate-source voltage is decreased in the negative direction. In the present exemplary embodiment, the P-channel depletion FET is fully turned on when the gate-source voltage is +6V or lower and fully turned off when the gate-source voltage is +9V or higher.

In FIG. 2, "D" represents the characteristics of a P-channel enhancement FET having normally-off characteristics, in other words, the drain current does not flow when the gate-source voltage is zero. The enhancement FET is turned on at a gate-source voltage having a larger absolute value than the depletion FET.

Here, the following describes an exemplary case where the main switch 110 includes the N-channel depletion FET having the characteristics represented by "A" in FIG. 2. In this case, the off voltage section 140 supplies a predetermined voltage determined according to the minimum value for the voltages applied to the first and second terminals. The following describes a case where the minimum value for the voltages applied to the first and second terminals is 0 V in the present exemplary embodiment.

In this case, the off voltage section 140 outputs a voltage of −14 V as the off voltage, for example. Accordingly, when the control signal transmitter 120 transmits an off signal to the switch controller 130 in order to turn off the main switch 110, the off controller 136 supplies the off voltage to the gate of the main switch 110 in response to the off signal. Since the on controller 132 disconnects the electrical connection from the first and second terminals to the gate-source voltage generator 134 in response to the off signal, the gate-source voltage generator 134 does not generate a gate-source voltage.

Accordingly, the voltage supplied to the gate of the main switch 110 is the off voltage output from the off voltage section 140. Here, since the minimum value for the voltages applied to the first and second terminals is 0V, the gate-source voltage of the main switch 110 is −14 V or lower. In other words, the main switch 110 is turned off irrespective of the voltages applied to the first and second terminals.

On the other hand, when the control signal transmitter 120 transmits an on signal to the switch controller 130 to turn on the main switch 110, the off controller 136 disconnects the electrical connection from the off voltage section 140 to the gate of the main switch 110 in response to the on signal. Furthermore, the on controller 132 forms electrical connection from the first and second terminals to the gate-source voltage generator 134 in response to the on signal. The gate-source voltage generator 134 generates a gate-source voltage depending on the voltages of the first and second terminals.

Here, the gate-source voltage generator 134 generates a gate-source voltage based on at least one of the voltages of the first and second terminals when it is intended to turn on the main switch 110. For example, the gate-source voltage generator 134 generates a higher or lower one of the voltage of the first terminal and the voltage of the second terminal.

The following describes a case where the first terminal is applied with +6 V and the second terminal is applied with +4.5 V, and the gate-source voltage generator 134 generates a lower one of the voltage of the first terminal and the voltage of the second terminal in the present exemplary embodiment. In this case, since the voltage of the second terminal is lower than the voltage of the first terminal, the gate-source voltage generator 134 generates +4.5 V, which is the voltage of the second terminal, and supplies the generated voltage to the gate of the main switch 110. Consequently, the gate-source voltage becomes 0 V and the main switch 110 is turned on since the source voltage of the main switch 110 becomes +4.5 V, which is the same as the voltage of the second terminal.

The following describes a case where the first terminal is applied with +6 V and the second terminal is applied with +7.5 V in the present exemplary embodiment. In this case, since the voltage of the first terminal is lower than the voltage of the second terminal, the gate-source voltage generator 134 generates +6 V, which is the voltage of the first terminal, and supplies the generated voltage to the gate of the main switch 110. Consequently, the gate-source voltage becomes 0 V and the main switch 110 is turned on since the source voltage of the main switch 110 is +6 V, which is the same as the voltage of the first terminal.

Here, a lower one of the voltage of the first terminal and the voltage of the second terminal serves as the source voltage of the main switch 110. Therefore, if the gate-source voltage generator 134 supplies, as the gate voltage, a lower one of the voltage of the first terminal and the voltage of the second terminal, the gate-source voltage generator 134 can supply a constant gate-source voltage that can turn on the main switch 110, irrespective of the direction of the current flowing through the main switch 110.

The gate-source voltage generator 134 having the above-described configuration includes, for example, a circuit that is configured to output the voltage of the second terminal when the voltage of the first terminal is higher than the voltage of the second terminal. In this case, the gate-source voltage generator 134 further includes a circuit that is configured to output the voltage of the first terminal when the voltage of the second terminal is higher than the voltage of the first terminal.

The following describes a case where the first terminal is applied with +6 V, the second terminal is applied with +4.5 V and the gate-source voltage generator 134 generates a higher one of the voltage of the first terminal and the voltage of the second terminal in the present exemplary embodiment. In this case, since the voltage of the first terminal is higher than the voltage of the second terminal, the gate-source voltage generator 134 generates +6V, which is the voltage of the first terminal, and supplies the generated voltage to the gate of the main switch 110. Consequently, the gate-source voltage becomes +1.5 V and the main switch 110 is turned on since the source voltage of the main switch 110 becomes +4.5 V, which is the same as the voltage of the second terminal.

The following describes a case where the first terminal is applied with +6V and the second terminal is applied with +7.5 V in the present exemplary embodiment. In this case, the gate-source voltage generator 134 generates +7.5 V of the second terminal and supplies the generated voltage to the gate of the main switch 110 since the voltage of the second terminal is higher than the voltage of the first terminal. Consequently, the gate-source voltage becomes +1.5V and the main switch 110 is turned on since the source voltage of the main switch 110 is +6 V, which is the same as the voltage of the first terminal.

As described above, the gate-source voltage generator 134 supplies, as the gate voltage, a higher or lower one of the voltage of the first terminal and the voltage of the second terminal. In this way, when the absolute value of the difference in potential between the first terminal and the second terminal is the same, the gate-source voltage generator 134 can supply a constant gate-source voltage that can turn on the main switch 110 irrespective of the direction of the current flowing through the main switch 110.

The gate-source voltage generator 134 having the above-described configuration includes a circuit that is configured to output the voltage of the first terminal when the voltage of the second terminal is lower than the voltage of the first terminal, for example. In this case, the gate-source voltage generator 134 further includes a circuit that is configured to output the voltage of the second terminal when the voltage of the first terminal is lower than the voltage of the second terminal.

The above has described an exemplary case where the gate-source voltage generator 134 generates a higher or lower one of the voltage of the first terminal and the voltage of the second terminal in the switch apparatus 100 relating to the present embodiment. Alternatively, the gate-source voltage generator 134 may supply, to the gate of the main switch 110, an intermediate voltage between the voltage of the first terminal and the voltage of the second terminal when it is intended to turn on the main switch 110.

For example, the following describes a case where the first terminal is applied with +6 V and the second terminal is applied with +4.5 V. In this case, the gate-source voltage generator 134 generates +5.25 V, which is the intermediate voltage, and supplies the generated voltage to the gate of the main switch 110. Consequently, the gate-source voltage becomes +0.75 V and the main switch 110 is turned on since the source voltage of the main switch 110 is +4.5 V, which is the same as the voltage of the second terminal.

The following describes a case where the first terminal is applied with +6 V and the second terminal is applied with +7.5V in the present exemplary embodiment. In this case, the gate-source voltage generator 134 generates +6.75V, which is the intermediate voltage and supplies the generated voltage to the gate of the main switch 110. Consequently, the gate-source voltage becomes +0.75 V and the main switch 110 is turned on since the source voltage of the main switch 110 is +6 V, which is the same as the voltage of the first terminal.

As described above, the gate-source voltage generator 134 supplies, to the gate of the main switch 110, an intermediate voltage that is obtained by halving the sum of the voltage of the first terminal and the voltage of the second terminal. Thus, when the absolute value of the difference in potential between the first terminal and the second terminal is the same, the gate-source voltage generator 134 can supply a constant gate-source voltage that can turn on the main switch 110 irrespective of the direction of the current flowing through the main switch 110.

The gate-source voltage generator 134 having the above-described configuration includes a circuit that is configured to output the voltage of the first terminal when the difference in voltage between the first terminal and the second terminal is equal to a predetermined voltage difference, for example, approximately 1.5 V. In this case, the gate-source voltage generator 134 further includes a circuit that is configured to output the voltage of the second terminal when the difference in voltage between the first terminal and the second terminal is equal to a predetermined voltage difference, for example, approximately 1.5 V.

The above has described an exemplary case where, in the switch apparatus 100 relating to the present embodiment, the main switch 110 includes an N-channel depletion FET. Alternatively, the main switch 110 may include a P-channel depletion FET, whose characteristics are represented by "C" in FIG. 2. In this case, the off voltage section 140 supplies a predetermined voltage according to the maximum value for the voltages applied to the first and second terminals. The following describes a case where the maximum voltage value of the voltages applied to the first and second terminals is 0 V in the present exemplary embodiment.

In this case, the off voltage section 140 outputs a voltage of +14 V as the off voltage, for example. Consequently, if the control signal transmitter 120 transmits the off signal to the switch controller 130 in order to turn off the main switch 110, the off controller 136 supplies to the gate of the main switch 110 the off voltage in response to the off signal. Furthermore, the on controller 132 disconnects the electrical connection from the first and second terminals to the gate-source voltage generator 134 in response to the off signal, and the gate-source voltage generator 134 thus does not generate the gate-source voltage.

Accordingly, the voltage supplied to the gate of the main switch 110 is the off voltage output from the off voltage section 140. Since the maximum value for the voltages applied to the first and second terminals is 0 V, the gate-source voltage of the main switch 110 is +14 V or higher. In other words, the main switch 110 is turned off irrespective of the voltages applied to the first and second terminals.

When the control signal transmitter 120 transmits the on signal to the switch controller 130 to turn on the main switch 110, the off controller 136 disconnects the electrical connection from the off voltage section 140 to the gate of the main switch 110 in response to the on signal. Furthermore, the on controller 132 forms electrical connection from the first and second terminals to the gate-source voltage generator 134 in response to the on signal. The gate-source voltage generator 134 generates a gate-source voltage according to the voltages of the first and second terminals.

The following describes an exemplary case where the first terminal is applied with −6 V, the second terminal is applied with −4.5 V and the gate-source voltage generator 134 generates a lower one of the voltage of the first terminal and the voltage of the second terminal in the present exemplary embodiment. In this case, since the voltage of the first terminal is lower than the voltage of the second terminal, the gate-source voltage generator 134 generates −6 V, which is the voltage of the first terminal, and supplies the generated voltage to the gate of the main switch 110. Consequently, the gate-source voltage becomes −1.5 V and the main switch 110 is turned on since the source voltage of the main switch 110 becomes −4.5 V, which is the same as the voltage of the second terminal.

The following describes a case where the first terminal is applied with −6 V and the second terminal is applied with −7.5 V in the present exemplary embodiment. In this case, since the voltage of the second terminal is lower than the voltage of the first terminal, the gate-source voltage generator 134 generates −7.5 V, which is the voltage of the second terminal, and supplies the generated voltage to the gate of the main switch 110. Consequently, the gate-source voltage becomes −1.5 V and the main switch 110 is turned on since the source voltage of the main switch 110 becomes −6 V, which is the same as the voltage of the first terminal.

The gate-source voltage generator 134 having the above-described configuration includes, for example, a circuit that is configured to output the voltage of the first terminal when the voltage of the second terminal is higher than the voltage of the first terminal. In this case, the gate-source voltage generator 134 further includes a circuit that is configured to output the voltage of the second terminal when the voltage of the first terminal is higher than the voltage of the second terminal.

The following describes a case where the first terminal is applied with −6 V, the second terminal is applied with −4.5 V, and the gate-source voltage generator 134 generates a higher one of the voltage of the first terminal and the voltage of the second terminal in the present exemplary embodiment. In this case, since the voltage of the second terminal is higher than the voltage of the first terminal, the gate-source voltage generator 134 generates −4.5 V of the second terminal and supplies the generated voltage to the gate of the main switch 110. Consequently, the gate-source voltage becomes 0 V and the main switch 110 is turned on since the source voltage of the main switch 110 becomes −4.5 V, which is the same as the voltage of the second terminal.

The following describes a case where the first terminal is applied with −6 V and the second terminal is applied with −7.5 V in the present exemplary embodiment. In this case, since the voltage of the first terminal is higher than the voltage of the second terminal, the gate-source voltage generator 134 generates −6 V, which is the voltage of the first terminal, and supplies the generated voltage to the gate of the main switch 110. Consequently, the gate-source voltage becomes 0V and the main switch 110 is turned on since the source voltage of the main switch 110 becomes −6 V, which is the same as the voltage of the first terminal.

As described above, the gate-source voltage generator 134 supplies a higher or lower one of the voltage of the first terminal and the voltage of the second terminal as the gate voltage. Thus, when the absolute value of the difference in potential between the first terminal and the second terminal is the same, the gate-source voltage generator 134 can supply a constant gate-source voltage that can turn on the main switch 110 irrespective of the direction of the current flowing through the main switch 110.

The gate-source voltage generator 134 having the above-described configuration includes, for example, a circuit that is configured to output the voltage of the first terminal when the voltage of the second terminal is lower than the voltage of the first terminal. In this case, the gate-source voltage generator 134 further includes a circuit that is configured to output the voltage of the second terminal when the voltage of the first terminal is lower than the voltage of the second terminal.

As discussed above, when the main switch 110 includes a P-channel depletion FET, the switch controller 130 can also switch on or off the main switch 110 by operating in a similar manner to the case where the main switch 110 has an N-channel depletion FET. Furthermore, when the gate-source voltage generator 134 is configured to supply an intermediate voltage between the voltage of the first terminal and the voltage of the second terminal to the gate of the main switch 110, the switch controller 130 can also switch on or off the main switch 110 by operating as described above.

The switch apparatus 100 relating to the above-described embodiment supplies a gate-source voltage that is determined according to the voltage of an electrical signal that is allowed to be transmitted or blocked from being transmitted through the main switch 110 by the switch apparatus 100, and thus can handle an electrical signal with a wider range of voltages. In addition, since the switch apparatus 100 supplies, to the main switch, a gate-source voltage that is determined according to the voltages of the first and second terminals, the electrical signals input into the first and second terminals can have a wide range of voltages.

Here, for example, the switch apparatus 100 can handle an electrical signal with a higher voltage if the FET included in the main switch 110 is formed by a GaN-based HEMT. For example, the switch apparatus 100 can allow an input voltage to be as high as several dozen voltages. In addition, the switch apparatus 100 allows the input signals input into the first and second terminals to have a wider range of voltages, such as several dozen voltages.

Note that an FET has such characteristics that the current flowing between the source and the drain varies according to the gate-source voltage as described above with reference to FIG. 2. Thus, the on resistance varies according to the gate-source voltage. When the absolute value of the difference in potential between the first terminal and the second terminal is the same, the switch apparatus 100 can apply to the main switch the same gate-source voltage irrespective of the direction of the current flowing through the main switch. In other words, when the absolute value of the difference in potential between the first terminal and the second terminal is the same, the FET of the main switch 110 can achieve the same on resistance irrespective of the direction of the current flowing through the main switch in the switch apparatus 100.

Figure 3:
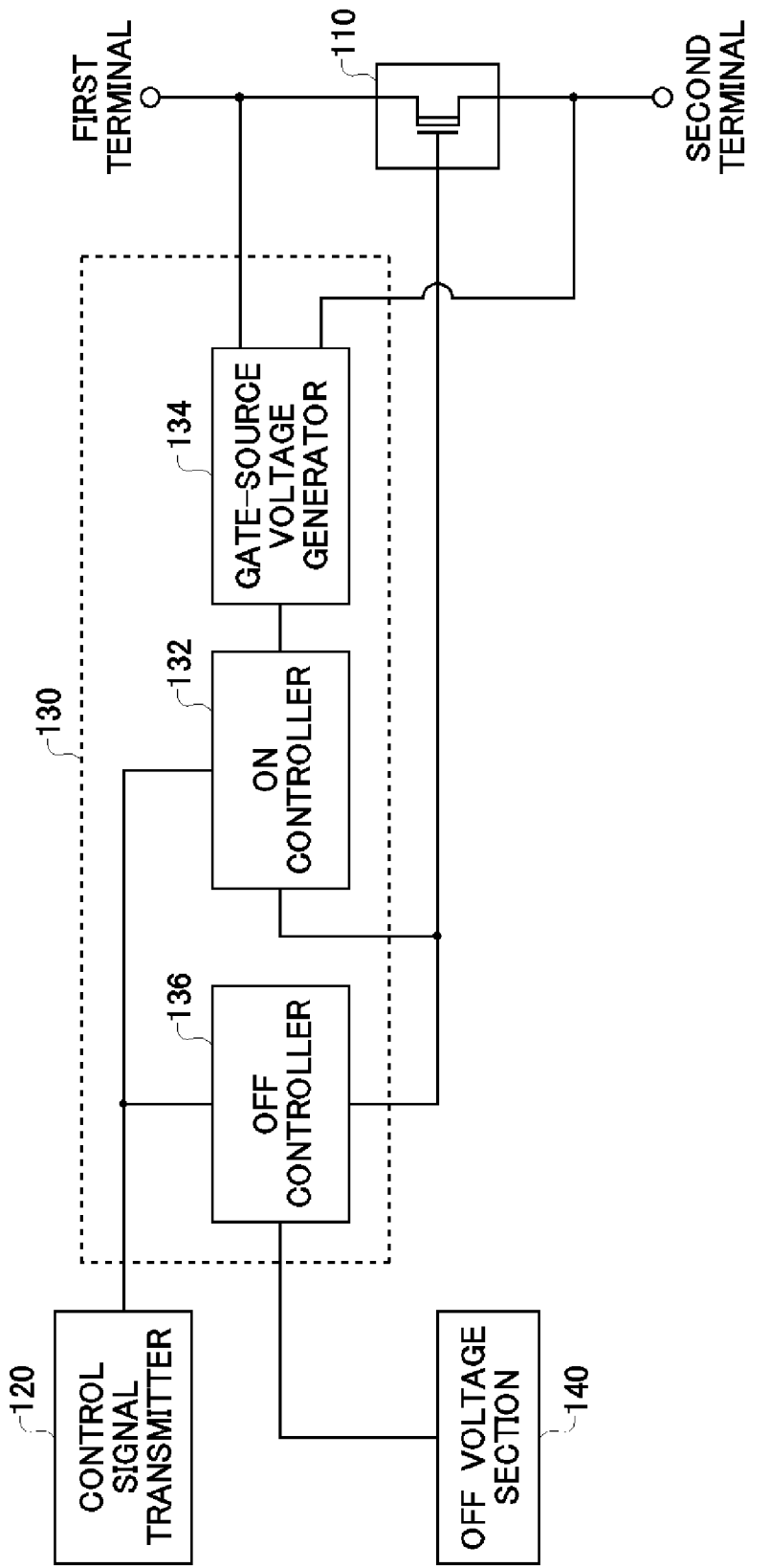
FIG. 3 shows a modification example of the switch apparatus 100 relating to the embodiment of the present invention.

FIG. 3 shows a modification example of the switch apparatus 100 relating to the present embodiment. The constituents of the switch apparatus 100 relating to the present modification example are assigned with the same reference numerals if they are substantially the same as the corresponding constituents of the switch apparatus 100 relating to the present embodiment shown in FIG. 1 and not described here.

According to the present modification example, the gate-source voltage generator 134 is connected to the first and second terminals, receives the voltages of the first and second terminals, and generates a gate-source voltage. The gate-source voltage generator 134 relating to the present modification example generates the gate-source voltage in substantially the same manner as in the present exemplary embodiment described above, and how the gate-source voltage generator 134 relating to the present modification example generates the gate-source voltage is not explained here. The gate-source voltage generator 134 is connected to the on controller 132 and outputs the generated gate-source voltage to the on controller 132.

According to the present modification example, the on controller 132 is connected to the gate of the main switch 110, and supplies the gate-source voltage output from the gate-source voltage generator 134 to the main switch 110 when it is intended to turn on the main switch 110. The on controller 132 blocks the gate-source voltage from being supplied to the main switch 110 when it is intended to turn off the main switch 110. The on controller 132 is connected to the control signal transmitter 120, and switches whether the gate-source voltage is allowed to be supplied or blocked from being supplied in accordance with the control signal from the control signal transmitter 120.

The switch apparatus 100 relating to the above-described modification example is different from the switch apparatus 100 described with reference to FIG. 1 in terms of how the on controller 132 included in the switch controller 130 is connected to the gate-source voltage generator 134. However, the switch controller 130 relating to the present modification example receives and outputs substantially the same electrical signals as the switch controller 130 described with reference to FIG. 1 and operates in substantially the same manner in response to the control signal.

Accordingly, the switch apparatus 100 relating to the present modification example can operate in substantially the same manner as described with reference to FIGS. 1 and 2. Specifically speaking, when the absolute value of the difference in potential between the first terminal and the second terminal is the same, the switch apparatus 100 relating to the present modification example can supply the same gate-source voltage to the main switch irrespective of the direction of the current flowing through the main switch.

Here, the on controller 132 relating to the embodiment shown in FIG. 1 receives the voltages of the first and second terminals and switches whether the two voltages are allowed to be supplied or blocked from being supplied to the gate-source voltage generator 134. Therefore, the on controller 132 relating to the embodiment shown in FIG. 1 can be constituted by using two or more switch circuits, for example.

On the other hand, the gate-source voltage generator 134 relating to the present modification example receives the voltages of the first and second terminals and outputs a gate-source voltage. Therefore, the gate-source voltage generator 134 relating to the present modification example can be constituted by using, for example, two-input one-output circuit. Thus, the on controller 132 can be constituted by using one or more switch circuits since the on controller 132 switches whether the gate-source voltage is allowed to be supplied or blocked from being supplied in accordance with the control signal. Consequently, the present modification example can have more simplified minimum switch circuit configuration than the embodiment shown in FIG. 1.

Referring to the switch apparatus 100 relating to the above-described embodiment, the on controller 132, the gate-source voltage generator 134, and the off controller 136 are each constituted by including, for example, a switch circuit and the like. In this case, the switch circuit includes, for example, an N-channel depletion FET, an N-channel enhancement FET, a P-channel depletion FET and/or a P-channel enhancement FET.

Figure 4:
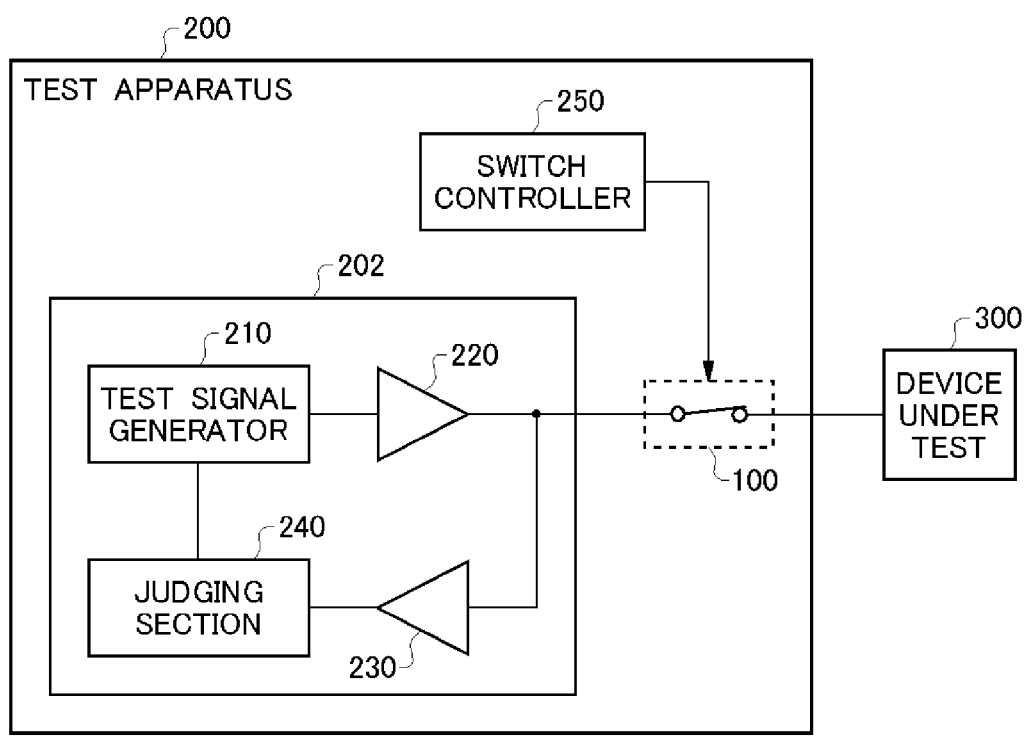
FIG. 4 shows the configuration of a test apparatus 200 relating to an embodiment of the present invention together with a device under test 300.

FIG. 4 shows the configuration of a test apparatus 200 relating to an embodiment of the present invention together with a device under test 300. The test apparatus 200 is configured to test the device under test 300, which is an analog circuit, a digital circuit, a memory a system on chip (SOC) and the like. The test apparatus 200 inputs into the device under test 300 a test signal that is generated based on a test pattern designed to test the device under test 300, and judges whether the device under test 300 is acceptable based on an output signal output from the device under test 300 in response to the test signal. The test apparatus 200 includes a tester 202 that is configured to exchange signals with the device under test, the switch apparatus 100, and a switch controller 250.

The tester 202 includes a test signal generator 210, a driver 220, a comparator 230, and a judging section 240. The test signal generator 210 generates a test signal to test the device under test 300 and outputs the test signal to the driver 220. The test signal generator 210 also generates an expected value corresponding to the generated test signal and outputs the expected value to the judging section 240.

The driver 220 supplies the test signal generated by the test signal generator 210 to the device under test 300. The comparator 230 obtains a logic value of a response signal output from the device under test 300 in response to the supplied test signal. The judging section 240 compares the logic value obtained by the comparator 230 against the expected value to judge whether the device under test 300 is acceptable.

The switch apparatus 100 is provided between the driver 220 and the device under test 300. The switch apparatus 100 connects or disconnects the driver 220 and the device under test 300 in accordance with the voltage of a control signal supplied from the switch controller 250. The switch controller 250 places the switch apparatus 100 in the connected state when the test signal generator 210 is performing tests and places the switch apparatus 100 in the disconnected state when the test signal generator 210 is not performing tests.

The switch controller 250 transmits a control signal to the control signal transmitter 120 included in the switch apparatus 100, for example. In this case, the control signal transmitter 120 transmits, to the switch controller 130, a control signal that is designed to turn on or off the main switch 110, according to the received control signal. Alternatively, the switch controller 250 may perform the operations of the control signal transmitter 120 included in the switch apparatus 100. In this case, the switch controller 250 directly transmits, to the switch controller 130, a control signal that is designed to turn on or off the main switch 110.

The test apparatus 200 relating to the above-described exemplary embodiment can perform tests using the switch apparatus 100 that is constituted using small, long-life and reliable FETs and that can handle a widened range of input voltages. Note that electrical signals may be transmitted in opposite directions between when the tester 202 transmits the test signal to the device under test 300 and when the tester 202 receives the response signal from the device under test 300. The test apparatus 200 can perform tests using the switch apparatus 100 that exhibits the same on resistance provided the voltage have the same amplitude even in the above case.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A switch apparatus comprising:
   a main switch that is provided between a first terminal and a second terminal; and
   a switch controller that, to turn on the main switch, supplies the same gate-source voltage to the main switch irrespective of a direction of a current flowing through the main switch;
   wherein to turn on the main switch, the switch controller supplies a higher or lower one of the voltage of the first terminal and the voltage of the second terminal to the gate of the main switch.

2. The switch apparatus as set forth in claim 1, wherein the switch controller includes an off controller that supplies, to a gate of the main switch, an off voltage that turns off the main switch, to turn off the main switch.

3. The switch apparatus as set forth in claim 1, wherein the main switch is a GaN semiconductor switch.

4. A test apparatus for testing a device under test, comprising:
   a tester that tests the device under test by exchanging signals with the device under test; and
   the switch apparatus as set forth in claim 1, the switch apparatus forming or disconnecting electrical connection between the tester and the device under test.

5. A switch apparatus comprising:
   a main switch that is provided between a first terminal and a second terminal; and
   a switch controller that, to turn on the main switch, supplies the same gate-source voltage to the main switch irrespective of a direction of a current flowing through the main switch;
   wherein to turn on the main switch, the switch controller supplies an intermediate voltage between the voltage of the first terminal and the voltage of the second terminal to the gate of the main switch.

6. The switch apparatus as set forth in claim 5, wherein the switch controller includes an off controller that supplies, to a gate of the main switch, an off voltage that turns off the main switch, to turn off the main switch.

7. The switch apparatus as set forth in claim 5, wherein the main switch is a GaN semiconductor switch.

8. A test apparatus for testing a device under test, comprising:
   a tester that tests the device under test by exchanging signals with the device under test; and
   the switch apparatus as set forth in claim 5, the switch apparatus forming or disconnecting electrical connection between the tester and the device under test.

9. A switch apparatus comprising:
   a main switch that is provided between a first terminal and a second terminal; and
   a switch controller that, to turn on the main switch, supplies the same gate-source voltage to the main switch irrespective of a direction of a current flowing through the main switch, the switch controller including
   a gate-source voltage generator that receives a voltage of the first terminal and a voltage of the second terminal to generate the gate-source voltage, and
   an on controller that allows the voltage of the first terminal and the voltage of the second terminal to be input into the gate-source voltage generator to turn on the main switch and blocks the voltage of the first terminal and the voltage of the second terminal from being input into the gate-source voltage generator to turn off the main switch.

10. The switch apparatus as set forth in claim 9, wherein the switch controller includes an off controller that supplies, to a gate of the main switch, an off voltage that turns off the main switch, to turn off the main switch.

11. The switch apparatus as set forth in claim 9, wherein the main switch is a GaN semiconductor switch.

12. A test apparatus for testing a device under test, comprising:
a tester that tests the device under test by exchanging signals with the device under test; and
the switch apparatus as set forth in claim 9, the switch apparatus forming or disconnecting electrical connection between the tester and the device under test.

13. A switch apparatus comprising:
a main switch that is provided between a first terminal and a second terminal; and
a switch controller that, to turn on the main switch, supplies the same gate-source voltage to the main switch irrespective of a direction of a current flowing through the main switch, the switch controller including
a gate-source voltage generator that receives a voltage of the first terminal and a voltage of the second terminal to generate the gate-source voltage, and
an on controller that allows the gate-source voltage output from the gate-source voltage generator to be supplied to the main switch to turn on the main switch and blocks the gate-source voltage from being supplied to the main switch to turn off the main switch.

14. The switch apparatus as set forth in claim 13, wherein the switch controller includes an off controller that supplies, to a gate of the main switch, an off voltage that turns off the main switch, to turn off the main switch.

15. The switch apparatus as set forth in claim 13, wherein the main switch is a GaN semiconductor switch.

16. A test apparatus for testing a device under test, comprising:
a tester that tests the device under test by exchanging signals with the device under test; and
the switch apparatus as set forth in claim 13, the switch apparatus forming or disconnecting electrical connection between the tester and the device under test.

* * * * *